(12) United States Patent
Shirouzu

(10) Patent No.: US 12,009,190 B2
(45) Date of Patent: Jun. 11, 2024

(54) PLASMA PROCESSING SYSTEM AND PLASMA PROCESSING METHOD

(71) Applicant: Panasonic Intellectual Property Management Co., Ltd., Osaka (JP)

(72) Inventor: Hiroshi Shirouzu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 100 days.

(21) Appl. No.: 17/658,670

(22) Filed: Apr. 11, 2022

(65) Prior Publication Data
US 2022/0336197 A1 Oct. 20, 2022

(30) Foreign Application Priority Data

Apr. 15, 2021 (JP) ................................. 2021-068963

(51) Int. Cl.
*H01J 37/32* (2006.01)
(52) U.S. Cl.
CPC .. *H01J 37/32935* (2013.01); *H01J 37/32082* (2013.01); *H01J 37/32926* (2013.01)
(58) Field of Classification Search
CPC ........... H01J 37/32082; H01J 37/32495; H01J 37/32642; H01J 37/32926; H01J 37/32935; H01J 37/32963
See application file for complete search history.

(56) References Cited

U.S. PATENT DOCUMENTS

| | | | |
|---|---|---|---|
| 2016/0113103 A1* | 4/2016 | Van Zyl | H05H 1/46 315/111.21 |
| 2018/0148838 A1* | 5/2018 | Sakane | C23C 16/45504 |
| 2019/0164726 A1* | 5/2019 | Tamamushi | H01J 37/32495 |
| 2019/0326102 A1* | 10/2019 | Mitsumori | H01L 21/67103 |
| 2021/0391149 A1* | 12/2021 | Kraus | H01J 37/3222 |

FOREIGN PATENT DOCUMENTS

JP 2019-160468 A 9/2019

* cited by examiner

*Primary Examiner* — Tung X Le
(74) *Attorney, Agent, or Firm* — PEARNE & GORDON LLP

(57) ABSTRACT

A disclosed plasma processing system 10 includes: a plasma processing apparatus 100 including a processing chamber 100a for plasma processing an object 400 to be processed, and at least one component 122, 131 which is at least partially disposed in the processing chamber 100a; a storage unit 301 for storing a recipe including a set value specifying a plasma processing condition; a tolerance determination unit 302 that determines a tolerance of the set value, based on a degree of deterioration of the at least one component 122, 131; and a recipe modification unit 303 that modifies the recipe such that the set value falls within the tolerance, when the set value is outside the tolerance.

9 Claims, 5 Drawing Sheets

PLASMA PROCESSING SYSTEM AND PLASMA PROCESSING METHOD

CROSS REFERENCE TO RELATED APPLICATION

The present application is based on and claims priority under 35 U.S.C. § 119 with respect to the Japanese Patent Application No. 2021-068963 filed on Apr. 15, 2021, of which entire content is incorporated herein by reference into the present application.

TECHNICAL FIELD

The present disclosure relates to a plasma processing system and a plasma processing method.

BACKGROUND

Conventionally, a plasma processing apparatus including a processing chamber for plasma processing an object to be processed has been known as disclosed in, for example, Patent Literature 1 (JP2019-160468). The plasma processing apparatus of Patent Literature 1 includes a component disposed in the processing chamber (e.g., a guide member for guiding the object).

SUMMARY

However, as the component deteriorates, it becomes difficult to appropriately plasma process the object, which necessitates the maintenance to be performed with the plasma processing apparatus turned off. However, depending on the situation, the turning off of the plasma processing apparatus is desired to be avoided. Under such circumstances, one of the objectives of the present disclosure is to make it possible to continue the plasma processing even when the component is deteriorated.

One aspect of the present invention relates to a plasma processing system. The plasma processing system includes: a plasma processing apparatus including a processing chamber for plasma-processing an object to be processed, and at least one component which is at least partially disposed in the processing chamber; a storage unit for storing a recipe including a set value specifying a plasma processing condition; a tolerance determination unit that determines a tolerance of the set value, based on a degree of deterioration of the at least one component; and a recipe modification unit that modifies the recipe such that the set value falls within the tolerance, when the set value is outside the tolerance.

Another aspect of the present invention relates to a plasma processing method. The plasma processing method uses a plasma processing system which includes: a plasma processing apparatus including a processing chamber for plasma processing an object to be processed, and at least one component which is at least partially disposed in the processing chamber; and a storage unit for storing a recipe including a set value specifying a plasma processing condition, the method including: a tolerance determination step of determining a tolerance of the set value, based on a degree of deterioration of the at least one component; and a recipe modification step of modifying the recipe such that the set value falls within the tolerance, when the set value is outside the tolerance.

According to the present disclosure, it is possible to continue a plasma processing even when the component is deteriorated.

DETAILED DESCRIPTION

Figure 1:
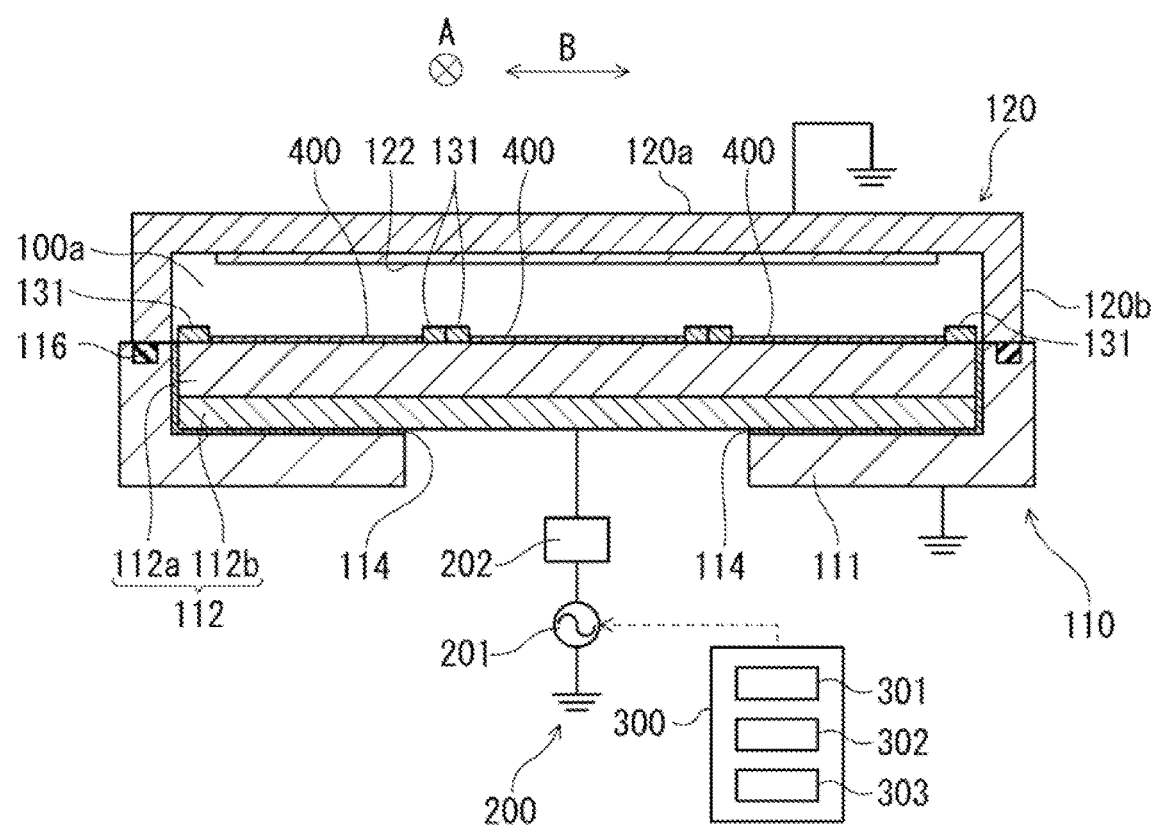
FIG. 1 is a schematic configuration diagram of an example of a plasma processing system according to the present disclosure.

Embodiments of a plasma processing system and a plasma processing method according to the present disclosure will be described below by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

Plasma Processing System

A plasma processing system according to the present disclosure includes a plasma processing apparatus having a processing chamber and at least one component, a storage unit, a tolerance determination unit, and a recipe modification unit.

The plasma processing apparatus is an apparatus for plasma processing an object to be processed (e.g., plasma cleaning, plasma dicing) in the processing chamber. The plasma processing apparatus may have a gas supply means for supplying a process gas into the processing chamber, a decompression means for reducing the pressure in the processing chamber, and a power supply unit for generating a plasma in the processing chamber.

The processing chamber is a space in which an object to be processed is plasma processed. The processing chamber may be partitioned by an openable and closable housing. The object to be processed may be, for example, a substrate used for electronic production, a circuit board including a substrate and a circuit formed thereon, a mounting substrate including a circuit board and electronic components mounted thereon, or a wafer. The object to be processed may be, for example, delivered into or out of the processing chamber by a transfer arm. The plasma processing may be, for example, a plasma cleaning processing for cleaning the object with plasma.

At least one component is at least partially disposed in the processing chamber. The at least one component may be, for example, a guide member for guiding the object, a transfer arm for delivering the object, a top plate attached to the ceiling of the housing that partitions the processing chamber, or a glass window attached to the housing. When the at least one component is deteriorated, this may cause an adverse event, such as abnormal discharge, decrease in etching rate, or decrease in uniformity (hereinafter, these situations are collectively referred to as adverse events such as abnormal discharge) during the plasma processing.

The storage unit stores a recipe including a set value that specifies a plasma processing condition. The storage unit may be included in the plasma processing apparatus, or may be included in an apparatus different from the plasma processing apparatus (e.g., a server connected via network with the plasma processing apparatus). Although the recipe can include various kinds of set values, the set value dealt with in the present disclosure is a set value related to the occurrence of the aforementioned adverse events such as abnormal discharge.

The plasma processing condition include, for example, the pressure in the processing chamber, the kind of a process gas to be introduced into the processing chamber for generating a plasma therein, the flow rate of the process gas, the output of the power supply unit for supplying a high-frequency power, the frequency of the high-frequency power, the plasma processing time, the number of the objects to be placed in the processing chamber, and the like. At least one of these plasma processing conditions is specified by a set value, and the set value is stored as a recipe in the storage unit. The set value may be determined in advance, or determined or modified later at appropriate timing. Examples of the set value include the output value of the power supply unit, the number of the objects to be placed in the processing chamber, and the plasma processing time. The set value is set within a tolerance having predetermined upper and lower limits, in order to prevent the occurrence of adverse events such as abnormal discharge during the plasma processing.

The tolerance determination unit determines the tolerance of the set value, based on the degree of deterioration of the at least one component. The tolerance determination unit may be included in the plasma processing apparatus, or may be included in an apparatus different from the plasma processing apparatus (e.g., a server connected via network with the plasma processing apparatus). The degree of deterioration of a component refers to a degree to which the component has deteriorated, and can be determined by various ways. For example, the degree of deterioration of a component can be determined, based on at least one parameter related to the component (e.g., the length of time of use, the number of times of use).

The degree of deterioration may be determined based on various monitoring data related to a target component for which the degree of deterioration is to be determined. The monitoring data may be acquired using various sensors. The sensor is mounted inside and/or outside the plasma processing apparatus. The monitoring data may be acquired in real time during the plasma processing or may be acquired after the plasma processing. The monitoring data may be stored in the storage unit. The acquired monitoring data includes at least one kind of monitoring data, and may include two or more kinds of monitoring data.

The monitoring data is not limited, and may be, for example: data related to delivering, such as the driving torque of the transfer arm, the load applied to the transfer arm, and the moving speed of the transfer arm; data related to gas evacuation, such as the internal pressure reached in the processing chamber, the pressure reduction speed and the time required until the predetermined pressure is reached from the atmospheric pressure, the pressure increase speed and the time required until the atmospheric pressure is reached from the predetermined pressure, the flow rate of the process gas supplied to the processing chamber during processing, the pressure in the chamber during processing, and the degree to which the pressure regulating valve is open during processing; and data related to the discharge state, such as the output of the high-frequency power supply unit, the processing time, the matching position of the matcher, the load impedance of the matcher, the RF reflected and/or incident waves, the self-bias voltage (Vdc), the amplitude (Vpp) of the high-frequency voltage, the emission spectrum, and the potential fluctuation between the probe electrodes disposed in the processing chamber (plasma monitor waveform).

The monitoring data further includes the data acquired in real time during the plasma processing or the data calculated from data acquired after the plasma processing. For example, the occurrence frequency of changes in voltage associated with micro arc discharge, which appears in the plasma monitor waveform, is also included in the monitoring data related to the discharge state.

On the other hand, the tolerance or permissible range of the set value refers to a range within which the plasma processing can be continued without accompanying adverse events such as abnormal discharge, as long as the set value is within the range. Conversely, when the set value is outside the tolerance, there is a possibility that adverse events such as abnormal discharge may occur during the plasma processing. The tolerance can vary depending on the degree of deterioration of a component which is at least partially disposed in the processing chamber.

When the set value that should be within the tolerance is outside the tolerance based on the deterioration degree of the component, the recipe modification unit modifies the recipe such that that the set value falls within the tolerance. The recipe modification unit may be included in the plasma processing apparatus, or may be included in an apparatus different from the plasma processing apparatus (e.g., a server connected via network with the plasma processing apparatus). The modified recipe is stored in the storage unit and used for the subsequent plasma processing. Thus, the plasma processing of the object can be continued without turning off the plasma processing apparatus for the maintenance of at least one component that has deteriorated.

Plasma Processing Method

A plasma processing method according to the present disclosure is performed using a plasma processing system which includes a plasma processing apparatus including the aforementioned processing chamber and the aforementioned at least one component, and the aforementioned storage unit, and includes a tolerance determination step, and a recipe modification step.

In the tolerance determination step, the tolerance of a set value is determined based on the degree of deterioration of the at least one component.

In the recipe modification step, when the set value that should be within the tolerance is outside the tolerance based on the deterioration degree of the component, the recipe is modified such that the set value falls within the tolerance. The modified recipe is stored in the storage unit and used for the subsequent plasma processing. Thus, the plasma processing of the object can be continued without turning off the plasma processing apparatus for the maintenance of at least one component that has deteriorated.

As described above, according to the present disclosure, it is possible to continue the plasma processing even when the component is deteriorated. This allows for flexible adaptation to various production plans.

The storage unit may further store the tolerance information that indicates the relationship between the degree of deterioration and the tolerance of the set value. The tolerance determination unit may determine the tolerance of the set value, based on the degree of deterioration and the tolerance information. The tolerance information may be, for example, a table data in which the degree of deterioration of each component is associated with the tolerance of the set value. According to this configuration, without performing complicated calculation processing, the tolerance of the set value can be simply and conveniently determined.

The storage unit may not store such tolerance information. In this case, the tolerance determination unit may be configured to calculate the tolerance of the set value, for example, based on the degree of deterioration of the component and an optional function.

At least one component may include a first component and a second component. The tolerance determination unit may determine a first tolerance of the set value, based on a first degree of deterioration which is the degree of deterioration of the first component, as well as a second tolerance of the set value, based on a second degree of deterioration which is the degree of deterioration of the second component. The recipe modification unit may modify the recipe such that the set value falls within both the first tolerance and the second tolerance, when the set value is outside at least one of the first tolerance and the second tolerance. According to this configuration, even when at least one of the first and second components is deteriorated, the recipe can be modified according to the degree of deterioration of the deteriorated component, and the plasma processing can be continued.

The at least one component may include another component, in addition to the first and second components. Any number of components may be included as another component. In this case, the tolerance determination unit may determine a third tolerance, based on the degree of deterioration of the another component, and the recipe modification unit may modify the recipe such that the set value falls within all of the first to third tolerances, when the set value is outside at least one of the first to third tolerances. Here, the third tolerance may include any number of tolerances, depending on the number of other components. According to this configuration, even when at least one of the first component, the second component, and the another component is deteriorated, the recipe can be modified according to the degree of deterioration of the deteriorated component, and the plasma processing can be continued.

The plasma processing apparatus may further include a power supply unit for supplying a high-frequency power for generating a plasma in the processing chamber. The set value may include an output value of the power supply unit. The upper limit of the tolerance of the set value may include an upper limit of the output value. According to this configuration, when at least one component is deteriorated, the output value of the power supply unit is restricted, and the occurrence of adverse events such as abnormal discharge during plasma processing can be suppressed.

The processing chamber may be configured such that a plurality of substrates can be placed inside as the object to be processed. The set value may include the number of the substrates to be placed in the processing chamber. The upper limit of the tolerance may include an upper limit of the number of the substrates. According to this configuration, when at least one component is deteriorated, the number of the substrates in the processing chamber is restricted, and the occurrence of adverse events such as abnormal discharge during plasma processing can be suppressed.

When lowering the upper limit of the number of the substrates placed in the processing chamber, the placement may be prohibited preferentially from the placement position farthest away from the central area of the processing chamber. This allows the substrates to be placed in the central area of the processing chamber where the plasma discharge tends to be relatively stable. In this way, in the case of restricting the number of the substrates, the plasma processing can be stably continued.

The set value may include a plasma processing time. The upper limit of the tolerance of the set value may include an upper limit of the plasma processing time. According to this configuration, when at least one component is deteriorated, the plasma processing time is restricted, and the occurrence of adverse events such as abnormal discharge during plasma processing can be suppressed.

The plasma processing apparatus may include the storage unit, the tolerance determination unit, and the recipe modification unit. At least one of the storage unit, the tolerance determination unit, and the recipe modification unit may be included in an apparatus different from the plasma processing apparatus (e.g., a server connected via network with the plasma processing apparatus).

A detailed description will be given below of examples of a plasma processing system and a plasma processing method according to the present disclosure, with reference to the drawings. The components and processes as described above may be applied to the components and processes of the examples of the plasma processing system and the plasma processing method as described below. The components and processes of the examples of the plasma processing system and the plasma processing method as described below may be changed on the basis of the description above. The items described below may be applied to the aforementioned embodiments. Of the components and processes of the examples of the plasma processing system and the plasma processing method as described below, those not essential for the plasma processing system and the plasma processing method according to the present disclosure may be omitted. It is to be noted that the figures shown below are schematic ones, and do not accurately reflect the shape and the number of the actual members.

Embodiment 1

The configuration of a plasma processing system 10 of Embodiment 1 is schematically illustrated in FIG. 1. The plasma processing system 10 includes a plasma processing apparatus 100 and various sensors (not shown). The various sensors are mounted inside and/or outside the plasma processing apparatus 100. The various sensors acquire various data (monitoring data) related to a substrate 400 and the plasma processing apparatus 100 during plasma processing. The monitoring data may be stored in a storage unit 301 as described later.

The plasma processing apparatus 100 of the present embodiment is a plasma cleaner for plasma cleaning the substrate 400 by generating a plasma in a processing chamber 100a as described later, but is not limited thereto. For example, the plasma processing apparatus 100 may be a plasma etching apparatus for plasma etching the substrate 400 or a plasma dicer for plasma dicing the substrate 400. The plasma processing apparatus 100 includes a lid member 120 and a base unit 110.

The lid member 120 has a ceiling 120a and a side wall 120b extending from the circumference of the ceiling 120a. The end surface of the side wall 120b of the lid member 120 comes in close contact with the periphery of a base body 111 of the base unit 110, forming the processing chamber 100a for plasma processing the substrate 400. The substrate 400 is an example of the object to be processed, but the object is not limited thereto. For example, the object may be a wafer. The substrate 400 may be, for example, a substrate used for electronic production, a circuit substrate including a substrate and a circuit formed thereon, or a mounted substrate including a circuit substrate and electronic components mounted thereon.

The lid member 120 has a top plate 122 disposed on the lower surface of the ceiling 120a. The top plate 122 is disposed for preventing the adhesion of the debris, dust, and the like generated by plasma processing to the ceiling 120a, and is detachable. The top plate 122 is an example of the first component, but the first component is not limited thereto. For example, the first component may be a transfer arm that delivers the substrate 400, or a glass window attached to the lid member 120. The glass window may not be included in the plasma processing apparatus.

The base unit 110 has an electrode body 112 on the surface facing the lid member 120. The electrode body 112 is supported on the base body 111 which is grounded. The electrode body 112 is connected to a power supply unit 200, while being electrically insulated from the base body 111. When the electrode body 112 is applied with a high-frequency power from the power supply unit 200 in the presence of a process gas, a plasma is generated in the processing chamber 100a. The lid member 120 functions as a counter electrode of the electrode body 112. An automatic matcher 202 has a function to prevent the interference between the high-frequency traveling wave and the reflected wave that flow between a high-frequency power source 201 and the electrode body 112.

The interior of the processing chamber 100a can be maintained in a decompressed atmosphere via an exhaust port (not shown) communicating with the processing chamber 100a. The exhaust port is in communication with a decompression means (not shown). The decompression means is constituted of a vacuum pump, an exhaust pipe, a pressure regulating valve, and the like. A seal member 116 for enhancing the hermeticity of the processing chamber 100a is provided between the periphery of the base body 111 and the end surface of the side wall 120b of the lid member 120. Although not shown, the plasma processing apparatus 100 includes a gas supply means for introducing a process gas serving as a plasma raw material into the processing chamber 100a. The gas supply means is constituted of a gas cylinder for supplying a process gas, such as argon, oxygen, or nitrogen, a pipe for introducing the process gas into the processing chamber 100a, and the like.

At the time of delivering the substrate 400 into and out of the processing chamber 100a, the lid member 120 is spaced apart from the base unit 110, to open the processing chamber 100a. The substrate 400 is delivered along a first direction A (the direction perpendicular to the paper plane in FIG. 1). On the other hand, when the substrate 400 is subjected to plasma processing, as shown in FIG. 1, the end surface of the side wall 120b of the lid member 120 and the periphery of the base body 111 are brought into close contact with each other, to close the processing chamber 100a. The opening and closing of the processing chamber 100a is accomplished by lifting and lowering the lid member 120. The lifting and lowering of the lid member 120 is driven by a predetermined driving source (not shown).

The electrode body 112 is supported on the base body 111 via an electrically insulating member 114. The electrode body 112 is constituted of an upper electrode body 122a facing the substrate 400 during plasma processing and a lower electrode body 122b facing the base body 111 via the insulating member 114. The upper electrode body 122a and the lower electrode body 122b are both formed of an electrically conductive material (conductor). The surface of the upper electrode body 122a on which the substrate 400 is placed may be covered with a dielectric material, such as ceramics (e.g., alumina, aluminum nitride) or quartz.

In the processing chamber 100a, the position of the substrate 400 on the electrode body 112 in a second direction B (the left-right direction in FIG. 1) is regulated by a pair of guide members 131. In the illustrated example, three substrates 400 are respectively regulated by three pairs of guide members 131. The number of substrates 400 placed on the electrode body 112 is at least one, and the number of the guide members 131 may be appropriately set depending on the number of the substrates 400. The guide member 131 is an example of the second component, but the second component is not limited thereto. For example, the second component may be a transfer arm that delivers the substrate 400, or a glass window attached to the lid member 120.

The plasma processing apparatus 100 further includes a controller 300. The controller 300 includes a storage unit 301, a tolerance determination unit 302, and a recipe modification unit 303. The controller 300 has a memory and a CPU capable of executing a program stored in the storage unit 301, and functions as other units, such as the tolerance determination unit 302 and the recipe modification unit 303, when the program is executed by the CPU.

The storage unit 301 stores a recipe including a set value specifying a plasma processing condition. In the recipe, the pressure in the processing chamber 100a, the kind and flow rate of the process gas, the output and frequency of the high-frequency power, the processing time, or the like may be set as the set value. A typical set value of the present embodiment includes an output value of the power supply unit 200. The storage unit 301 further stores a tolerance information indicating the relationship between later-described first and second deterioration degrees and the tolerance of the set value (in this example, the output value of the power supply unit 200). This tolerance information may be a table data in which the degree of deterioration of each component is associated with the tolerance of the set value. The storage unit 301 is constituted of, for example, a nonvolatile memory.

The tolerance determination unit 302 determines a first tolerance of the output value of the power supply unit 200, based on the first deterioration degree which is the degree of deterioration of the top plate 122 and the tolerance information stored in the storage unit 301. The tolerance determination unit 302 determines a second tolerance of the output value of the power supply unit 200, based on the second deterioration degree which is the degree of deterioration of the guide member 131 and the tolerance information stored in the storage unit 301. For example, the tolerance determination unit 302 may refer to a table data as described above, to determine each tolerance depending on each deterioration degree.

The recipe modification unit 303 modifies the recipe such that the output value of the power supply unit 200 falls within both the first tolerance and the second tolerance, when the output value of the power supply unit 200 is outside at least one of the first tolerance and the second tolerance. For example, given that the upper limit of the first tolerance is 500 W and the upper limit of the second tolerance is 400 W, when the output value of the power supply unit 200 in the recipe is 800 W, the recipe modification unit 303 modifies the recipe such that the output value of the power supply unit 200 becomes 400 W or less. At this time, the recipe modification unit 303 may modify one or more other set values, in conformity with reducing the output value of the power supply unit 200. For example, the plasma processing time may be lengthened, or the number of times of the plasma processing may be increased.

On the other hand, when the output value of the power supply unit 200 is within both the first tolerance and the second tolerance, the recipe modification unit 303 does not perform recipe modification for the output value of the power supply unit 200. In other words, when one set value is within the tolerance, the recipe modification unit 303 does not modify the recipe for the one set value.

—Plasma Processing Method—

Figure 2:
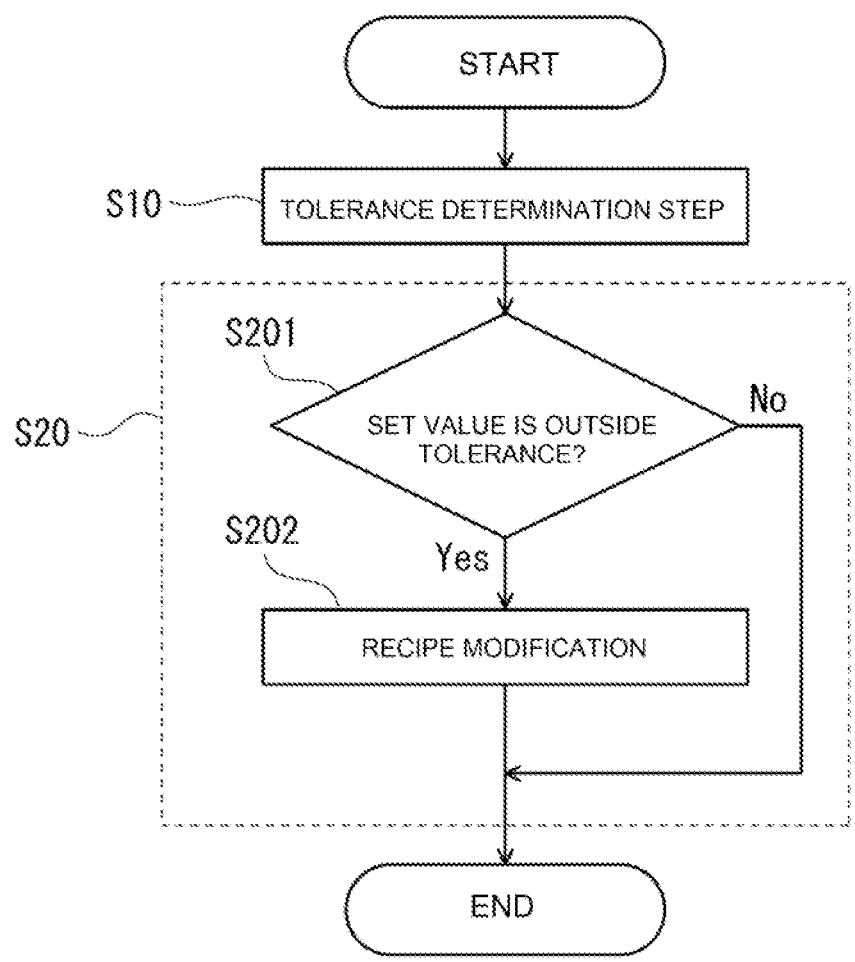
FIG. 2 is a flowchart of a plasma processing method according to the present disclosure.

Next, a description will be given of a plasma processing method using the above-described plasma processing system 10. The plasma processing method includes a tolerance determination step S10 and a recipe modification step S20, as shown in FIG. 2.

In the tolerance determination step S10, the tolerance determination unit 302 determines the first tolerance of a set value (in this example, the output value of the power supply unit 200), based on the first deterioration degree and the tolerance information, and the second tolerance of the set value, based on the second deterioration degree and the tolerance information.

In the recipe modification step S20, when the set value (in this example, the output value of the power supply unit 200) is outside at least one of the first tolerance and the second tolerance (when "Yes" in S201), the recipe modification unit 303 modifies the recipe such that the set value falls within both the first tolerance and the second tolerance.

On the other hand, in the recipe modification step S20, when the set value is within both the first tolerance and the second tolerance (when "No" in S201), the recipe is not modified for the above set value.

Figure 3:
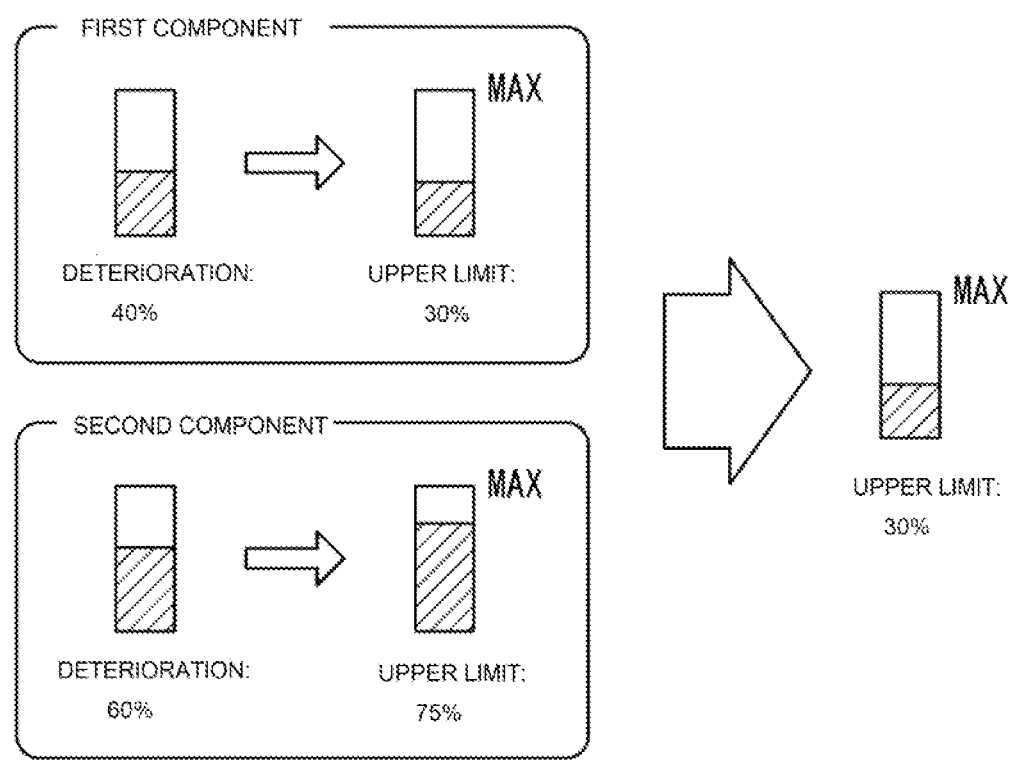
FIG. 3 is a conceptual diagram of a plasma processing method of Embodiment 1.

FIG. 3 conceptually illustrates a plasma processing method according to the present embodiment. As shown in FIG. 3, it is given that the degree of deterioration of the first component (first deterioration degree) is 40%, and the upper limit of the output value of the power supply unit 200 corresponding thereto is 30% of the maximum (the maximum value set in the recipe). Furthermore, it is given that the degree of deterioration of the second component (second deterioration degree) is 60%, and the upper limit of the output value of the power supply unit 200 corresponding thereto is 75% of the maximum. In this given case, in the recipe modification step S20, when the output value of the power supply unit 200 exceeds 30% of the maximum (i.e., the smallest of the upper limits), the recipe modification unit 303 modifies the recipe such that the output value of the power supply unit 200 becomes 30% or less of the maximum.

Embodiment 2

Embodiment 2 of the present disclosure will be described. The present embodiment is different from the above-described Embodiment 1 in the set value included in the recipe. In the following, the difference from Embodiment 1 will be mainly described.

A typical set value of the present embodiment includes the number of the substrates 400 to be placed in the processing chamber 100a. The storage unit 301 stores a tolerance information indicating the relationship between the first and second deterioration degrees and the tolerance of the set value (in this example, the number of the substrates 400).

The tolerance determination unit 302 determines a first tolerance of the number of the substrates 400 to be placed, based on the first deterioration degree which is the degree of deterioration of the top plate 122 and the tolerance information stored in the storage unit 301. The tolerance determination unit 302 determines a second tolerance of the number of the substrates 400 to be placed, based on the second deterioration degree which is the degree of deterioration of the guide member 131 and the tolerance information stored in the storage unit 301.

When the number of the substrates 400 is outside at least one of the first tolerance and the second tolerance (when "Yes" in S201 in FIG. 2), the recipe modification unit 303 modifies the recipe such that the number of the substrates 400 to be placed falls within both the first tolerance and the second tolerance. For example, given that the upper limit of the first tolerance is two, and the upper limit of the second tolerance is one, when the number of the substrates 400 in the recipe is three, the recipe modification unit 303 modifies the recipe such that the number of the substrates 400 to be placed becomes one. At this time, it is preferable that the central area of the processing chamber 100a (in the example of FIG. 1, the placement area at the center) is preferentially selected as the placement area of the substrate 400.

On the other hand, when the number of the substrates 400 is within both the first tolerance and the second tolerance (when "No" in S201 in FIG. 2), the recipe modification unit 303 does not perform recipe modification for the number of the substrates 400 to be placed.

Figure 4:
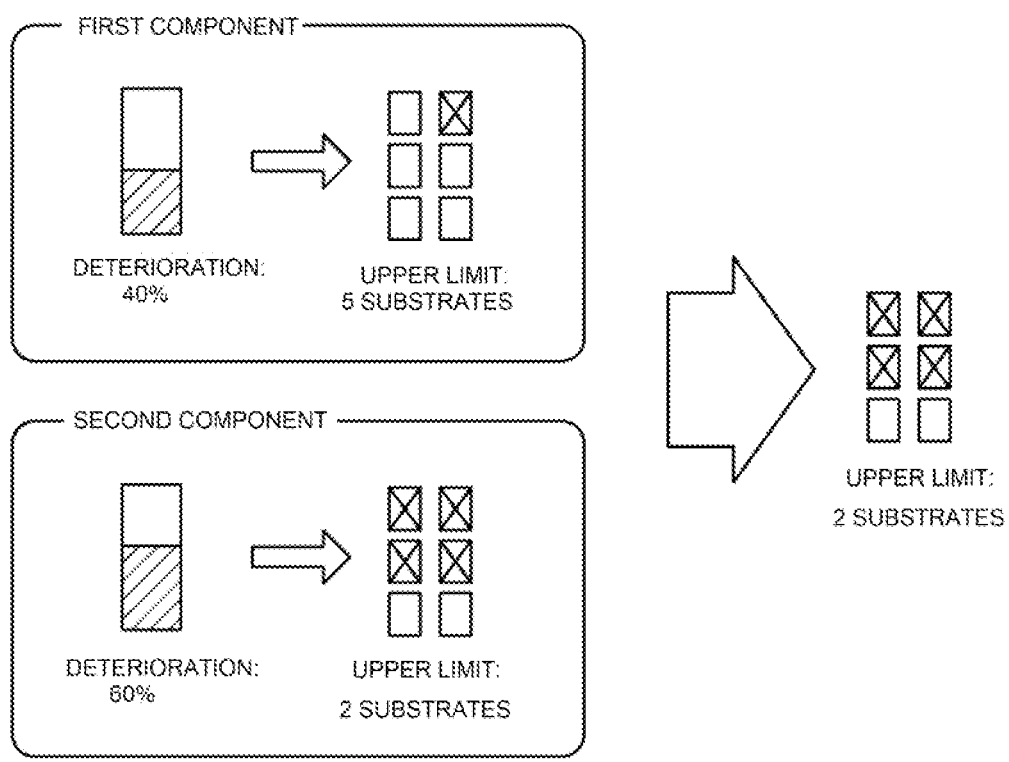
FIG. 4 is a conceptual diagram of a plasma processing method of Embodiment 2.

FIG. 4 conceptually illustrates a plasma processing method according to the present embodiment. As shown in FIG. 4, it is given that the degree of deterioration of the first component (first deterioration degree) is 40%, and the upper limit of the number of the substrates 400 to be placed corresponding thereto is five. Furthermore, it is given that the degree of deterioration of the second component (second deterioration degree) is 60%, and the upper limit of the number of the substrates 400 to be placed corresponding thereto is two. In this given case, in the recipe modification step S20, when the number of the substrates 400 exceeds two (i.e., the smallest of the upper limits), the recipe modification unit 303 modifies the recipe such that the number of the substrates 400 to be placed becomes two or less.

Embodiment 3

Embodiment 3 of the present disclosure will be described. The present embodiment is different from the above-described Embodiment 1 in the set value included in the recipe. In the following, the difference from Embodiment 1 will be mainly described.

A typical set value of the present embodiment includes the plasma processing time. The storage unit 301 stores a tolerance information indicating the relationship between the first and second deterioration degrees and the tolerance of the set value (in this example, the plasma processing time).

The tolerance determination unit 302 determines a first tolerance of the plasma processing time, based on the first deterioration degree which is the degree of deterioration of the top plate 122 and the tolerance information stored in the storage unit 301. The tolerance determination unit 302 determines a second tolerance of the plasma processing time, based on the second deterioration degree which is the degree of deterioration of the guide member 131 and the tolerance information stored in the storage unit 301.

When the plasma processing time is outside at least one of the first tolerance and the second tolerance (when "Yes" in S201 in FIG. 2), the recipe modification unit 303 modifies the recipe such that plasma processing time falls within both the first tolerance and the second tolerance. For example, given that the upper limit of the first tolerance is 60 seconds, and the upper limit of the second tolerance is 30 seconds, when the plasma processing time is 90 seconds, the recipe modification unit 303 modifies the recipe such that plasma processing time becomes 30 seconds or less. At this time, the recipe modification unit 303 may modify one or more other set values, in conformity with shortening the plasma processing time. For example, the output value of the power supply unit 200 may be raised, or the number of times of the plasma processing may be increased.

On the other hand, when the plasma processing time is within both the first tolerance and the second tolerance (when "No" in S201 in FIG. 2), the recipe modification unit 303 does not perform recipe modification for the plasma processing time.

Figure 5:
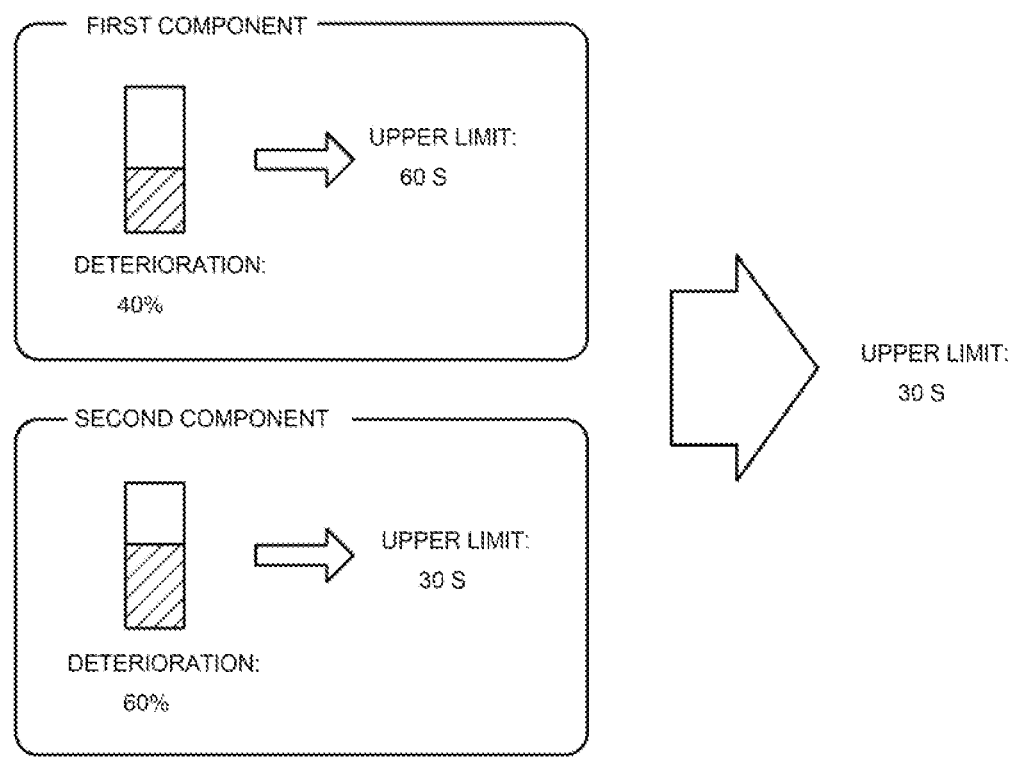
FIG. 5 is a conceptual diagram of a plasma processing method of Embodiment 3.

FIG. 5 conceptually illustrates a plasma processing method according to the present embodiment. As shown in FIG. 5, it is given that the degree of deterioration of the first component (first deterioration degree) is 40%, and the plasma processing time corresponding thereto is 60 seconds. Furthermore, it is given that the degree of deterioration of the second component (second deterioration degree) is 60%, and the upper limit of the plasma processing time corresponding thereto is 30 seconds. In this given case, in the recipe modification step S20, when the plasma processing time exceeds 30 seconds (i.e., the smallest of the upper limits), the recipe modification unit 303 modifies the recipe such that the plasma processing time becomes 30 seconds or less.

INDUSTRIAL APPLICABILITY

The present disclosure can be utilized for a plasma processing system and a plasma processing method.

REFERENCE NUMERALS

- 10: plasma processing system
  - 100: plasma processing apparatus
    - 100*a*: processing chamber
    - 110: base unit
      - 111: base body
      - 112: electrode body
        - 122*a*: upper electrode body
        - 122*b*: lower electrode body
      - 114: insulating member
      - 116: seal member
    - 120: lid member
      - 120*a*: ceiling
      - 120*b*: side wall
    - 122: top plate (component)
    - 131: guide member (component)
  - 200: power supply unit
    - 201: high-frequency power source
    - 202: automatic matcher
  - 300: controller
    - 301: storage unit
    - 302: tolerance determination unit
    - 303: recipe modification unit
- 400: substrate (object to be processed)

What is claimed is:

1. A plasma processing system, comprising:
a plasma processing apparatus including a processing chamber for plasma processing an object to be processed, and at least one component which is at least partially disposed in the processing chamber;
a storage unit for storing a recipe including a set value specifying a plasma processing condition;
a tolerance determination unit that determines a tolerance of the set value, based on a degree of deterioration of the at least one component; and
a recipe modification unit that modifies the recipe such that the set value falls within the tolerance, when the set value is outside the tolerance.

2. The plasma processing system according to claim 1, wherein
the storage unit further stores a tolerance information indicating a relationship between the degree of deterioration and the tolerance, and
the tolerance determination unit determines the tolerance, based on the degree of deterioration and the tolerance information.

3. The plasma processing system according to claim 1, wherein
the at least one component includes a first component and a second component,
the tolerance determination unit determines a first tolerance of the set value, based on a first degree of deterioration which is the degree of deterioration of the first component, and a second tolerance of the set value, based on a second degree of deterioration which is the degree of deterioration of the second component, and
the recipe modification unit modifies the recipe such that the set value falls within both the first tolerance and the second tolerance, when the set value is outside at least one of the first tolerance and the second tolerance.

4. The plasma processing system according to claim 1, wherein
the plasma processing apparatus further includes a power supply unit for supplying a high-frequency power for generating a plasma in the processing chamber,
the set value includes an output value of the power supply unit, and
an upper limit of the tolerance includes an upper limit of the output value.

5. The plasma processing system according to claim 1, wherein
the processing chamber is configured such that a plurality of substrates serving as the object to be processed is configured to be placed inside,
the set value includes the number of the substrates to be placed in the processing chamber, and
an upper limit of the tolerance includes an upper limit of the number of the substrates.

6. The plasma processing system according to claim 1, wherein
the set value includes a plasma processing time, and
an upper limit of the tolerance includes an upper limit of the plasma processing time.

7. The plasma processing system according to claim 1, wherein the plasma processing apparatus includes the storage unit, the tolerance determination unit, and the recipe modification unit.

8. A plasma processing method using a plasma processing system which includes: a plasma processing apparatus including a processing chamber for plasma processing an object to be processed, and at least one component which is at least partially disposed in the processing chamber; and a storage unit for storing a recipe including a set value specifying a plasma processing condition, the plasma processing method comprising:

a tolerance determination step of determining a tolerance of the set value, based on a degree of deterioration of the at least one component; and a recipe modification step of modifying the recipe such that the set value falls within the tolerance, when the set value is outside the tolerance.

9. The plasma processing method according to claim 8, wherein the at least one component includes a first component and a second component, in the tolerance determination step, a first tolerance of the set value is determined, based on a first degree of deterioration which is the degree of deterioration of the first component, and a second tolerance of the set value is determined, based on a second degree of deterioration which is the degree of deterioration of the second component, and in the recipe modification step, the recipe is modified such that the set value falls within both the first tolerance and the second tolerance, when the set value is outside at least one of the first tolerance and the second tolerance.

* * * * *